US011441804B2

(12) United States Patent
Kim et al.

(10) Patent No.: US 11,441,804 B2
(45) Date of Patent: Sep. 13, 2022

(54) THERMOSTAT WIRE DETECTION

(71) Applicant: Ademco Inc., Golden Valley, MN (US)

(72) Inventors: Hyunki Kim, Rogers, MN (US); Robert D. Juntunen, Minnetonka, MN (US); Jesus Omar Ponce, Chihuahua (MX); Liliana Reategui, Saint Anthony, MN (US); Anuj Kohli, Apple Valley, MN (US); David Mulhouse, Minnetonka, MN (US)

(73) Assignee: Ademco Inc., Golden Valley, MN (US)

( * ) Notice: Subject to any disclaimer, the term of this patent is extended or adjusted under 35 U.S.C. 154(b) by 428 days.

(21) Appl. No.: 16/719,363

(22) Filed: Dec. 18, 2019

(65) Prior Publication Data

US 2021/0190356 A1 Jun. 24, 2021

(51) Int. Cl.
| | |
|---|---|
| *F24F 11/49* | (2018.01) |
| *F24F 11/38* | (2018.01) |
| *G01R 31/55* | (2020.01) |
| *F24F 11/88* | (2018.01) |

(52) U.S. Cl.
CPC ............ *F24F 11/49* (2018.01); *F24F 11/88* (2018.01); *G01R 31/55* (2020.01)

(58) Field of Classification Search
CPC ............ F24F 11/49; F24F 11/88; G01R 31/55
See application file for complete search history.

(56) References Cited

U.S. PATENT DOCUMENTS

| 8,708,242 B2* | 4/2014 | Conner ............... F24F 11/62 236/94 |
| 9,092,039 B2* | 7/2015 | Fadell ................. G05B 15/02 |
| 9,116,529 B2* | 8/2015 | Warren .............. G05D 23/1902 |
| 9,890,971 B2* | 2/2018 | Ribbich ............... F24F 11/30 |
| 10,088,189 B2* | 10/2018 | Conner ............... F24F 11/62 |

(Continued)

OTHER PUBLICATIONS

Brochure entitled "Panasonic Automation Controls Catalog," No. ASCTB359E, Panasonic Corporation, 2018, 12 pp. (Applicant points out, in accordance with MPEP 609.04(1), that the year of publication, 2018, is sufficiently earlier than he effective U.S. filing date, so that the particular month of publication is not in issue.).

(Continued)

*Primary Examiner* — Ramesh B Patel
(74) *Attorney, Agent, or Firm* — Shumaker & Sieffert, P.A.

(57) ABSTRACT

A device for detecting a wire configuration connecting a thermostat and HVAC equipment includes fan controller circuitry, AC controller circuitry, switching circuitry, and processing circuitry. The fan controller circuitry is configured to operate a fan unit of the HVAC equipment using a G pin in a first wire configuration and using a K pin in a second wire configuration. The AC controller circuitry is configured to operate an AC unit of the HVAC equipment using a Y pin in the first wire configuration and the K pin in the second wire configuration. The switching circuitry is configured to refrain from electrically coupling the Y pin and the K pin in response to a deactivation signal. The processing circuitry is configured to determine the HVAC equipment is in the first wire configuration in response to determining the AC controller circuitry receives power while outputting the deactivation signal to the switching circuitry.

20 Claims, 11 Drawing Sheets

(56) References Cited

U.S. PATENT DOCUMENTS

| | | | | |
|---|---|---|---|---|
| 10,208,972 | B2* | 2/2019 | Novotny | F24F 11/89 |
| 10,452,083 | B2* | 10/2019 | Warren | G05D 23/19 |
| 10,546,472 | B2* | 1/2020 | Alberth, Jr. | G08B 7/066 |
| 10,551,105 | B2* | 2/2020 | Smith | F25B 49/022 |
| 10,605,475 | B2* | 3/2020 | Combe | G05B 15/02 |
| 10,655,881 | B2* | 5/2020 | Sinha | F24F 11/63 |
| 10,677,484 | B2* | 6/2020 | Ribbich | F24F 11/30 |
| 10,732,651 | B2* | 8/2020 | Mucignat | H04L 12/283 |
| 10,760,809 | B2* | 9/2020 | Gillette | F24F 11/65 |
| 10,895,883 | B2* | 1/2021 | Rezny | F24F 11/30 |
| 10,941,951 | B2* | 3/2021 | Hern | F24F 1/08 |
| 11,131,474 | B2* | 9/2021 | Schwegler | F24F 11/0008 |
| 11,162,698 | B2* | 11/2021 | Ajax | F24F 11/0001 |
| 2021/0190356 | A1* | 6/2021 | Kim | F24F 11/49 |

OTHER PUBLICATIONS

Brochure entitled "LMC555 CMOS Timer," by Texas Instruments, 2019, 32 pp. (Applicant points out, in accordance with MPEP 609.04(1), that the year of publication, 2019, is sufficiently earlier than the effective U.S. filing date, so that the particular month of publication is not in issue.).

* cited by examiner

THERMOSTAT WIRE DETECTION

TECHNICAL FIELD

This disclosure relates to thermostats configured to maintain a system temperature to a set of desired setpoints, such as, for example, building heating, central heating, air conditioners, heating, ventilation, and air conditioning (HVAC) systems, and other thermostats.

BACKGROUND

Thermostats may control heating, ventilation, and air conditioning (HVAC) equipment in a closed clop to reduce error between a desired set point or set of desired setpoints. Thermostats may be configured in a C configuration, where a thermostat controls a fan unit using a R wire and a G wire and controls an air conditioner unit using the R wire and a Y wire. However, to reduce a number of wires that are routed between HVAC equipment and the thermostat, some thermostats may be configured in a wire saver configuration, where the thermostat controls the fan unit using a R wire and a K wire and controls the air conditioner unit using the R wire and the K wire. In this way, the thermostat may control HVAC equipment using two wires instead of three wires, which may help to simplify connection of the thermostat to the HVAC equipment.

SUMMARY

In general, the disclosure is directed to devices, systems, and techniques for detecting a wire configuration connecting a thermostat and heating, ventilation, and air conditioning (HVAC) equipment. For example, techniques described herein may include processing circuitry configured to determine whether HVAC equipment is configured in a first wire configuration (e.g., a C wire configuration) or a second wire configuration (e.g., a K wire configuration) based on whether fan controller circuitry and/or Air Conditioning (AC) controller circuitry is receives power from a power supply. In this way, the processing circuitry may determine a wire configuration without relying on an input from a user or customer. Moreover, in some examples, the processing circuitry may determine whether a pin has been incorrectly wired, which may help to reduce a setup time and improve a reliability of the HVAC equipment.

In one example, a device for detecting a wire configuration connecting a thermostat and HVAC equipment includes: fan controller circuitry configured to operate a fan unit of the HVAC equipment, wherein the fan controller circuitry operates the fan unit using a G pin when the HVAC equipment is arranged in a first wire configuration and wherein the fan controller circuitry operates the fan unit using a K pin when the HVAC equipment is arranged in a second wire configuration; AC controller circuitry configured to operate an AC unit of the HVAC equipment, wherein the AC controller circuitry operates the AC unit using a Y pin when the HVAC equipment is arranged in the first wire configuration and wherein the AC controller circuitry operates the AC unit using the K pin when the HVAC equipment is arranged in the second wire configuration; switching circuitry configured to electrically couple the Y pin and the K pin in response to an activation signal and to refrain from electrically coupling the Y pin and the K pin in response to a deactivation signal; and processing circuitry configured to determine the HVAC equipment is arranged in the first wire configuration in response to determining the AC controller circuitry receives power from a power supply while outputting the deactivation signal to the switching circuitry.

In another example, a method for detecting a wire configuration connecting a thermostat and HVAC equipment includes: outputting, by processing circuitry, a deactivation signal to switching circuitry, wherein the switching circuitry is configured to refrain from electrically coupling a Y pin and a K pin in response to the deactivation signal, wherein the fan controller circuitry operates a fan unit of the HVAC equipment using a G pin when the HVAC equipment is arranged in a first wire configuration and wherein the fan controller circuitry operates the fan unit using the K pin when arranged in a second wire configuration; wherein the AC controller circuitry operates the AC unit using the Y pin when the HVAC equipment is arranged in the first wire configuration and wherein the AC controller circuitry operates the AC unit using the K pin when the HVAC equipment is arranged in the second wire configuration; and determining, by processing circuitry, the HVAC equipment is arranged in the first wire configuration in response to determining the AC controller circuitry receives power from a power supply while outputting the deactivation signal to the switching circuitry.

In another example, a system for detecting a wire configuration connecting a thermostat and HVAC equipment includes: a power supply; fan controller circuitry configured to operate a fan unit of the HVAC equipment, wherein the fan controller circuitry operates the fan unit using a G pin when the HVAC equipment is arranged in a first wire configuration and wherein the fan controller circuitry operates the fan unit using a K pin when the HVAC equipment is arranged in a second wire configuration; AC controller circuitry configured to operate an AC unit of the HVAC equipment, wherein the AC controller circuitry operates the AC unit using a Y pin when the HVAC equipment is arranged in the first wire configuration and wherein the AC controller circuitry operates the AC unit using the K pin when the HVAC equipment is arranged in the second wire configuration; switching circuitry configured to electrically couple the Y pin and the K pin in response to an activation signal and to refrain from electrically coupling the Y pin and the K pin in response to a deactivation signal; and processing circuitry configured to determine the HVAC equipment is arranged in the first wire configuration in response to determining the AC controller circuitry receives power from the power supply while outputting the deactivation signal to the switching circuitry.

The summary is intended to provide an overview of the subject matter described in this disclosure. It is not intended to provide an exclusive or exhaustive explanation of the systems, device, and methods described in detail within the accompanying drawings and description below. Further details of one or more examples of this disclosure are set forth in the accompanying drawings and in the description below. Other features, objects, and advantages will be apparent from the description and drawings, and from the claims.

BRIEF DESCRIPTION OF DRAWINGS

Like reference characters denote like elements throughout the description and figures.

DETAILED DESCRIPTION

This disclosure describes devices, systems, and techniques for detecting a presence of a wire connecting a thermostat and Heating, Ventilation, and Air Conditioning (HVAC) equipment. For example, rather than relying on a manual input or on discrete components to detect whether a wire is connected to a pin, a processing circuitry may determine whether HVAC equipment is arranged in a first wire configuration or a second configuration based on whether Air Conditioning (AC) controller circuitry and/or fan controller circuitry receives power from a power supply. In some systems, information on whether the AC controller circuitry and/or fan controller circuitry receives power from the power supply is readily available to processing circuitry, for example, to help to ensure safe and reliable operation of the AC controller circuitry. In this way, the processing circuitry may determine a wire configuration for the HVAC equipment with little or no additional components. Moreover, the processing circuitry may, in some examples, detect whether the HVAC equipment has been incorrectly wired, thereby improving a reliability of the HVAC equipment compared to systems that do not determine a wire configuration for the HVAC equipment.

Figure 1A:
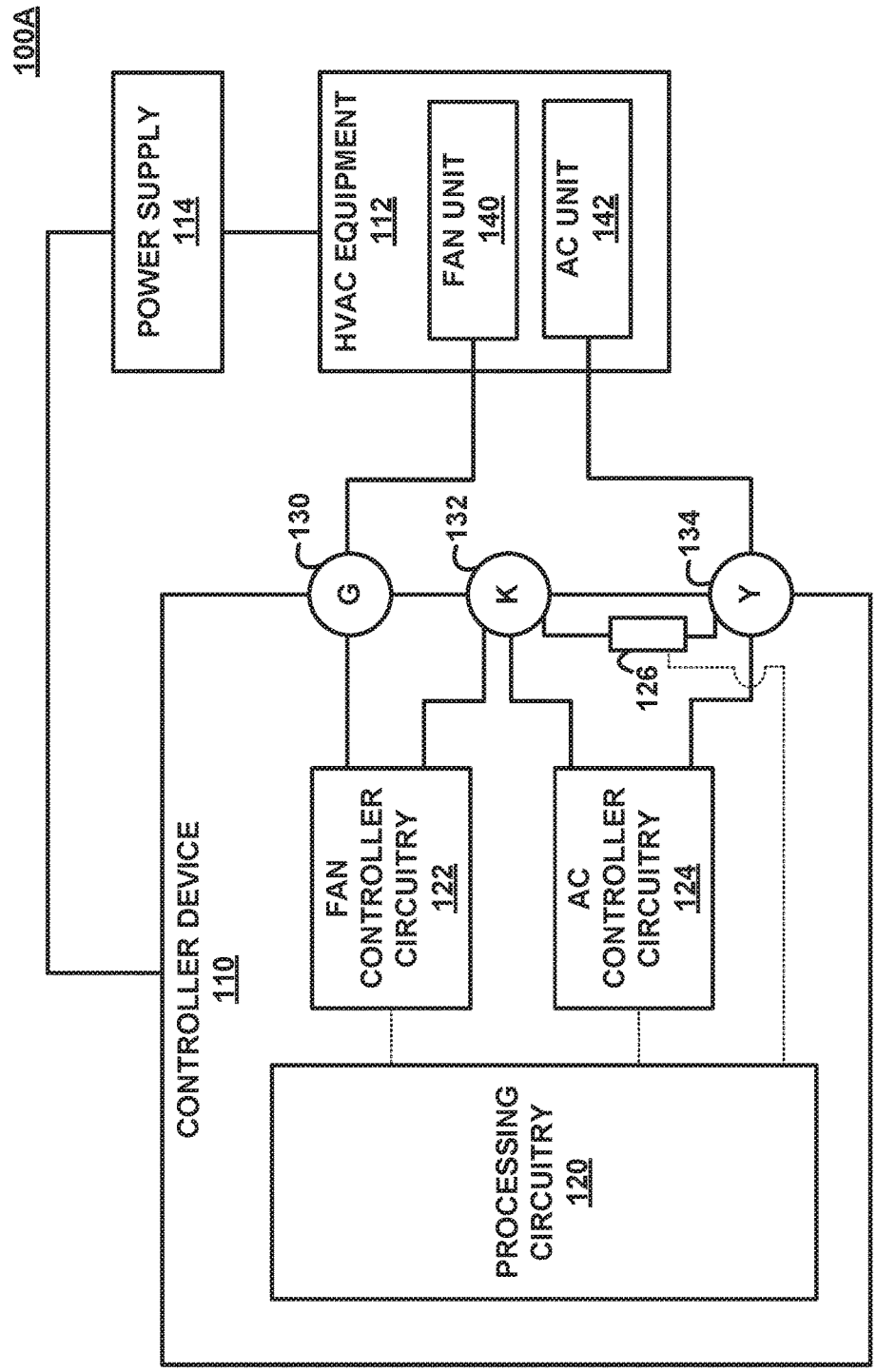
FIG. 1A is a block diagram illustrating a device for detecting a wire configuration connecting a thermostat and Heating, Ventilation, and Air Conditioning (HVAC) equipment arranged in a first wire configuration, in accordance with one or more techniques of this disclosure.

FIG. 1A is a block diagram illustrating a device 110 (also referred to herein as "controller device 110") for detecting a wire configuration connecting a thermostat and HVAC equipment arranged in a first wire configuration, in accordance with one or more techniques of this disclosure. System 100A may include controller device 110, HVAC equipment 112, and power supply 114.

HVAC equipment 112 may include fan unit 140 and AC unit 142. Fan unit 140 may include one or more fans configured to provide airflow in a building. In some examples, fan unit 140 may be configured to provide airflow using ventilation equipment within a building, such as, for example, air ducts to deliver and remove air. AC unit 142 may include one or more air conditioning devices configured to remove heat from an interior of a building. Examples of air conditioning devices may include, but are not limited to, a refrigerant air conditioner, an evaporative cooler, a geothermal cooling device, or another air conditioning device. In some examples, an air conditioner may include a dehumidifier.

Power supply 114 may represent an AC voltage supplied from a utility connection. For example, power supply 114 may be 120 Volts AC (VAC). In some examples, power supply 114 may be an output of a transformer (e.g., an AC main transformer, also referred to herein as simply "AC mains"). For example, power supply 114 may be an output a transformer configured to step down a voltage from a voltage supplied by a utility supply, a transformer configured to filter noise spikes, and/or a transformer configured to electrically isolate system 100A.

Controller device 110 may represent circuitry configured to operate HVAC equipment 112 using power supply 114. In some examples, controller device 110 may be part of a thermostat. In some examples, HVAC equipment 112 may be remote to controller device 110. For example, HVAC equipment 112 may be arranged in a basement of a residence and controller device 110 may be arranged on a first floor of the residence. As such, wires for connecting HVAC equipment 112 may be routed and connected in various configurations with one or more of G pin 130, K pin 132, and Y pin 134.

G pin 130 may be for connection with a green wire. In some examples, G pin 130 may be configured to output a fan signal that indicates when a thermostat (e.g., controller device 110) calls for turning on fan unit 140. In some examples, Y pin 134 may be for a connection with a yellow wire. Y pin 134 may be configured to output a cooling signal that indicates when the thermostat calls for turning on AC unit 142. In some systems, K pin 132 may perform one or more functions of G pin 130 and Y pin 134. For example, K pin 132 may be configured to output a fan signal that indicates when the thermostat calls for turning on fan unit 140 and to output a cooling signal that indicates when the thermostat calls for turning on AC unit 142. In some instances, K pin 132 may be used with optional wire saver circuitry (see FIG. 1B).

Controller device 110 may include additional pins not shown in FIG. 1A. For example, controller device 110 may include an R pin for connecting with power supply 114. In the example of FIG. 1A, controller device 110 is arranged in a first wire configuration such that fan controller circuitry 122 operates fan unit 140 using G pin 130 and AC controller circuitry 124 operates AC unit 142 using Y pin 134. In other examples, system 100A may be arranged in other wire configurations (see FIG. 1B).

Controller device 110 may include processing circuitry 120, fan controller circuitry 122, and AC controller circuitry 124. Although shown separately in FIGS. 1A and 1B for ease of explanation, processing circuitry 120, fan controller circuitry 122, and AC controller circuitry 124 may in fact be highly integrated into common or shared circuitry. Fan controller circuitry 122 may be configured to operate fan unit 140 of HVAC equipment 112. In some examples, fan controller circuitry 122 may be formed as a fully-integrated AC switch using a switching element (e.g., a Field-Effect Transistor such as, for example, a Metal-Oxide-Semiconductor Field-Effect Transistors (MOSFET)). In some examples, fan controller circuitry 122 may be configured to output an indication that fan controller circuitry 122 receives power and/or an indication that fan controller circuitry 122 does not receive power.

AC controller circuitry 124 may be configured to operate AC unit 142 of the HVAC equipment 112. In some examples, AC controller circuitry 124 may be formed as a fully-integrated AC switch using a switching element (e.g., a Field-Effect Transistor such as, for example, a Metal-Oxide-Semiconductor Field-Effect Transistors (MOSFET)). In some examples, AC controller circuitry 124 may be configured to output an indication that AC controller circuitry 124 receives power and/or an indication that AC controller circuitry 124 does not receive power.

Switching circuitry 126 may be configured to electrically couple Y pin 134 and K pin 132 in response to an activation signal and to refrain from electrically coupling the Y pin 134 and the K pin 132 in response to a deactivation signal. For example, switching circuitry 126 may include a system-on-chip comprising a relay and an oscillation circuit for activating the relay in response to the activation signal. In some examples, switching circuitry 126 may include an isolation transformer and one or more switching elements (see FIGS. 6, 7).

Processing circuitry 120 may be configured to determine whether HVAC equipment 112 is arranged in a first wire configuration (e.g., a C configuration) and/or to determine whether HVAC equipment 112 is arranged in a second wire configuration (e.g., a wire saver configuration). In some examples, processing circuitry 120 may be a microcontroller on a single integrated circuit containing a processor core, memory, inputs, and outputs. For example, processing circuitry 120 may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. In some examples, processing circuitry 120 may be a combination of one or more analog components and one or more digital components.

In operation, processing circuitry 120 may output a deactivation signal to switching circuitry 126. Processing circuitry 120 may determine HVAC equipment 112 is arranged in a first wire configuration shown in FIG. 1A in response to determining AC controller circuitry 124 receives power from power supply 114 (e.g., via Y pin 134) while outputting the deactivation signal to switching circuitry 126.

Figure 1B:
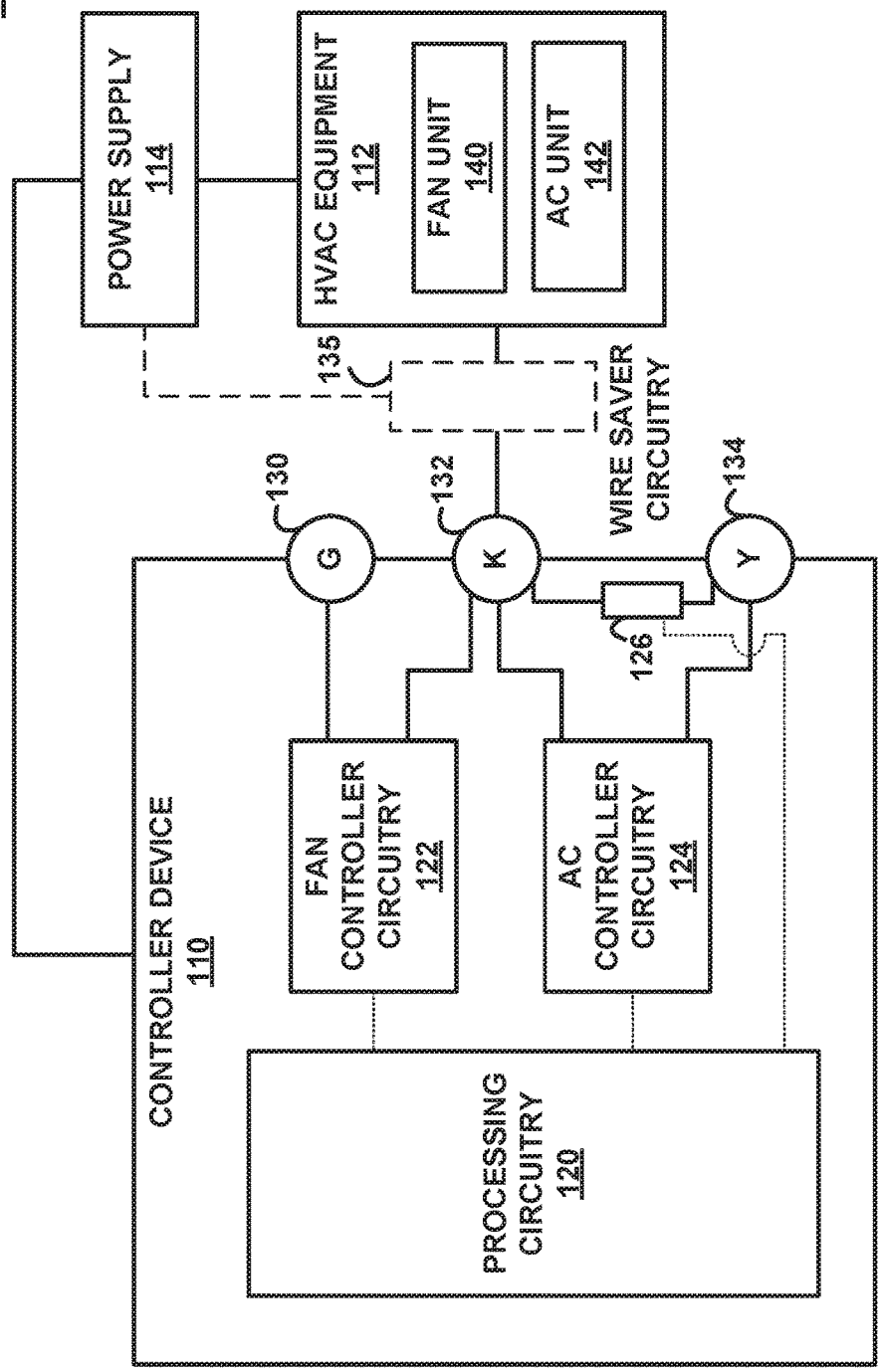
FIG. 1B is a block diagram illustrating the device of FIG. 1A arranged in a second wire configuration, in accordance with one or more techniques of this disclosure.

FIG. 1B is a block diagram illustrating the device 110 of FIG. 1A is arranged in a second wire configuration, in accordance with one or more techniques of this disclosure. System 100B may include similar components to system 100A of FIG. 1A. However, in the example of FIG. 1B, controller device 110 may be arranged in a second wire configuration (e.g., a wire saver configuration) such that fan controller circuitry 122 operates fan unit 140 using K pin 132 and AC controller circuitry 124 operates AC unit 142 using K pin 132. For example, controller device 110 may be optionally connected to HVAC equipment using wire saver circuitry 135. In this way, fewer wires may be routed between controller device 110 (e.g., a thermostat) and HVAC equipment 112 compared to the first configuration illustrated in FIG. 1A.

In operation, processing circuitry 120 may output an activation signal to switching circuitry 126. Processing circuitry 120 may determine AC controller circuitry 124 does not receive power from power supply 114 while outputting the deactivation signal to switching circuitry 126. In this example, processing circuitry 120 may output a deactivation signal to switching circuitry 126. Processing circuitry 120 may determine HVAC equipment 112 is arranged in the second wire configuration (e.g., wire saver configuration) in response to determining AC controller circuitry 124 does not receive power from power supply 114 while outputting the deactivation signal to switching circuitry 126 and determining AC controller circuitry 124 receives power from power supply 114 while outputting the activation signal to switching circuitry 126.

Figure 2A:
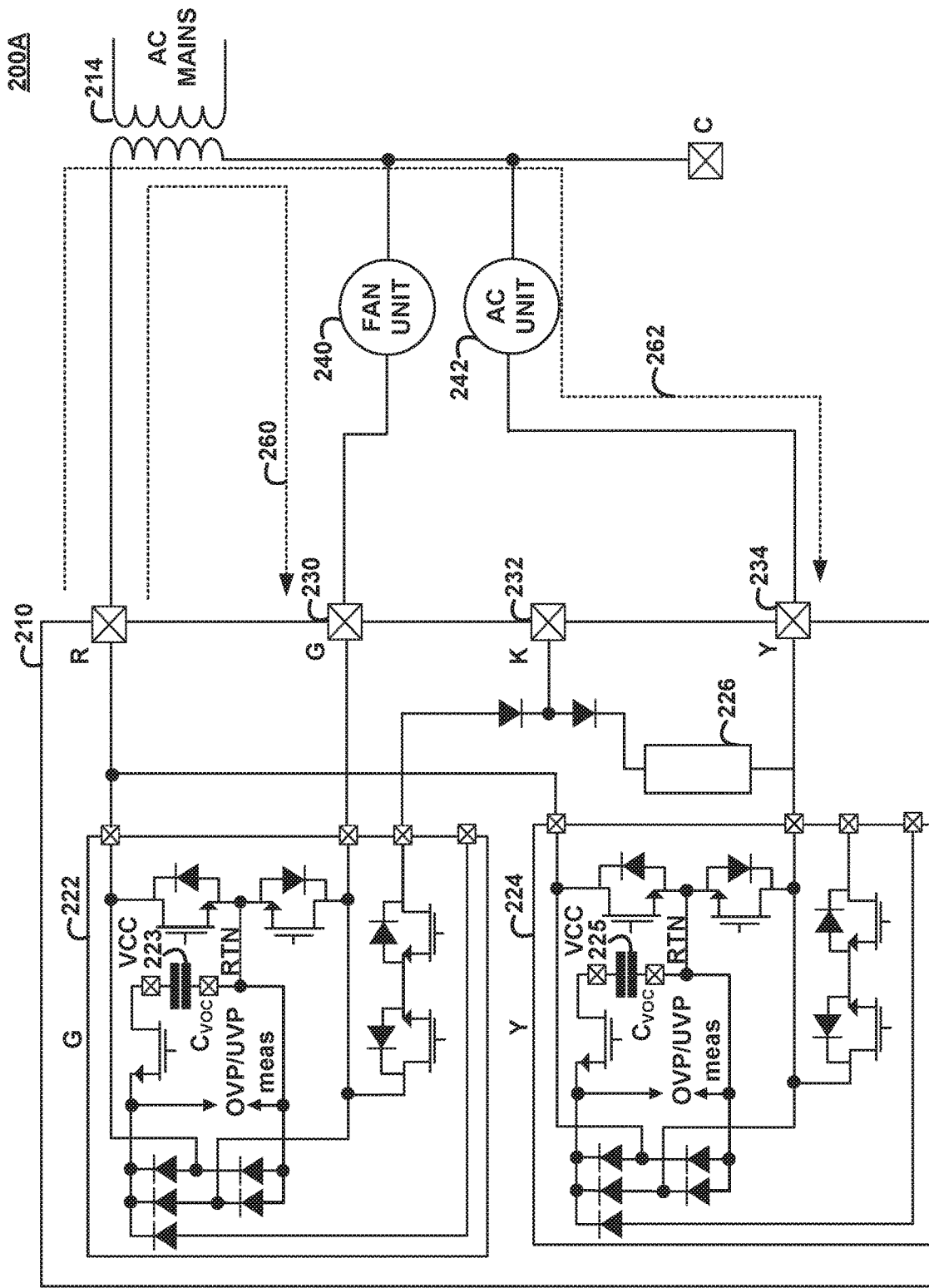
FIG. 2A is a block diagram illustrating an example circuit for detecting a wire configuration connecting a thermostat and HVAC equipment arranged in a first wire configuration, in accordance with one or more techniques of this disclosure.

FIG. 2A is a block diagram illustrating an example circuit 200A for detecting a wire configuration connecting a thermostat and HVAC equipment arranged in a first wire configuration, in accordance with one or more techniques of this disclosure. Circuit 200A may include controller device 210, power supply 214, fan unit 240, AC unit 242, and power supply 214 (also referred to herein as "AC mains"), which may be examples of controller device 110, power supply 114, fan unit 140, AC unit 142, and power supply 114 of system 100A of FIG. 1A, respectively. Additionally, controller device 210 may include G pin 230, K pin 232, and Y pin 234, which may be examples of G pin 130, K pin 132, and Y pin 134 of controller device 110 of FIG. 1A, respectively. In the example of FIG. 2A, controller device 210 is arranged in a first wire configuration such that fan controller circuitry 222 operates fan unit 240 using G pin 230 and AC controller circuitry 224 operates AC unit 242 using Y pin 234.

As shown, when in the first configuration, fan controller circuitry 222 may be configured to receive power from power supply 214 along current path 260, which charges capacitor 223. In some examples, fan controller circuitry 222 may be configured to output an indication that fan controller circuitry 222 receives power and/or an indication that fan controller circuitry 222 does not receive power. For instance, fan controller circuitry 222 may be configured to output a logical '1' to processing circuitry (e.g., processing circuitry 120 of FIG. 1A) when capacitor 223 is charging and to output a logical '0' to processing circuitry when capacitor 223 is not charging.

In the example of FIG. 2A, when in the first configuration, AC controller circuitry 224 may be configured to receive power from power supply 214 along current path 262, which charges capacitor 225. In some examples, AC controller circuitry 224 may be configured to output an indication that AC controller circuitry 224 receives power and/or an indication that AC controller circuitry 224 does not receive power. For instance, AC controller circuitry 224 may be configured to output a logical '1' to processing circuitry (e.g., processing circuitry 120 of FIG. 1A) when capacitor 225 is charging and to output a logical '0' to processing circuitry when capacitor 225 is not charging.

Figure 2B:
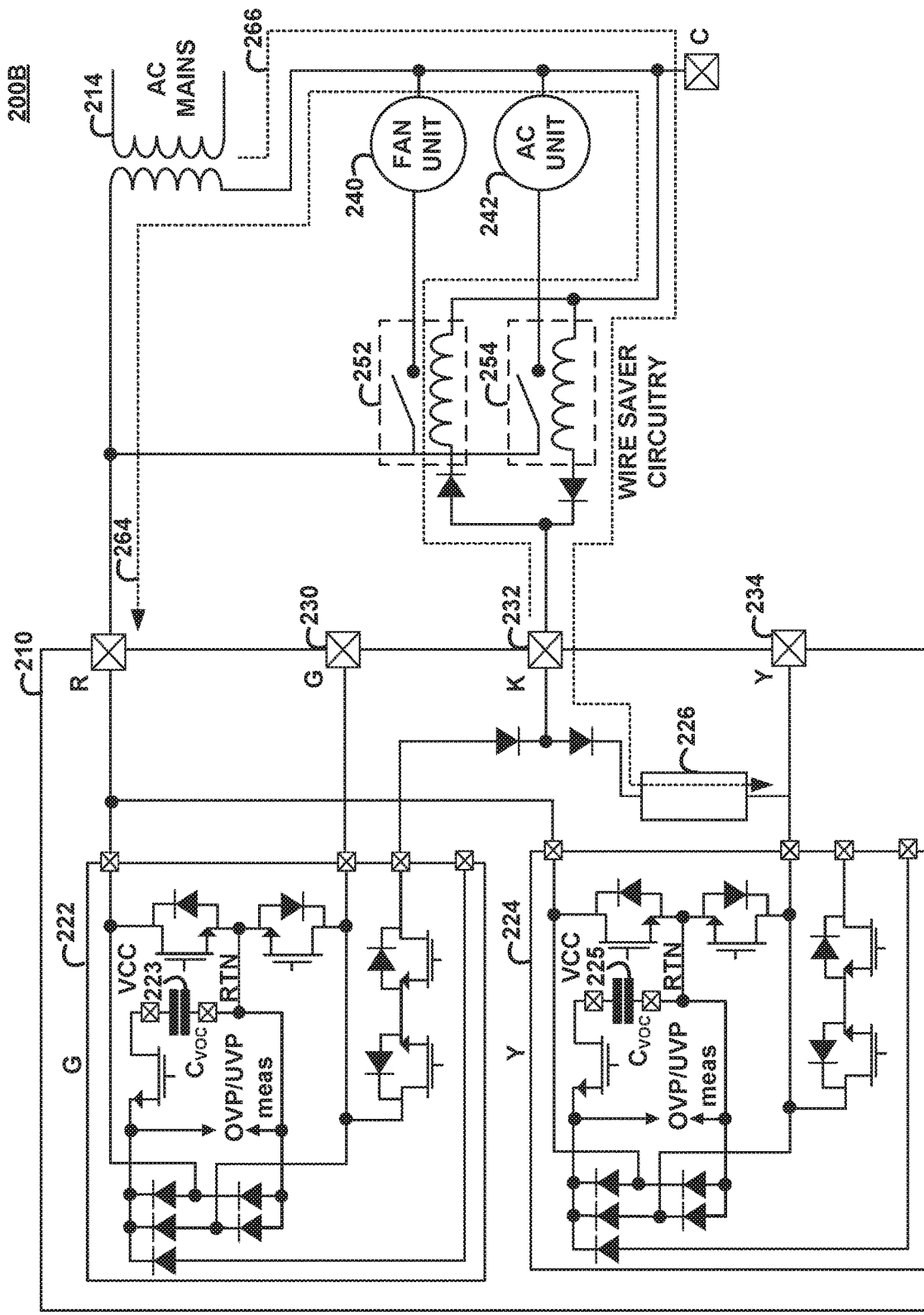
FIG. 2B is a block diagram illustrating an example circuit for detecting a wire configuration connecting a thermostat and HVAC equipment arranged in a second wire configuration, in accordance with one or more techniques of this disclosure.

FIG. 2B is a block diagram illustrating an example circuit 200B for detecting a wire configuration connecting a thermostat and HVAC equipment arranged in a second wire configuration, in accordance with one or more techniques of this disclosure. In the example of FIG. 2B, wire saver circuitry is formed by at least relay 252 and relay 254. In this example, relay 252 may connect fan unit 240 to K pin 232 and relay 254 may connect AC unit 242 to K pin 232. Relay 252 may electrically couple fan unit 240 to power supply 214 in response to receiving current in at a first polarity (e.g., positive or negative) from the K pin and in response to receiving current in at a second polarity (e.g., negative or positive) from the K pin. In some examples, the first polarity is opposite to the second polarity. For instance, relay 252 may electrically couple fan unit 240 to power supply 214 in response to receiving current.

Relay 254 may electrically couple AC unit 242 to power supply 214 in response to receiving current in at the first polarity (e.g., positive or negative) from the K pin and refrain from electrically coupling AC unit 242 to power supply 214 in response to receiving current in at a second polarity (e.g., negative or positive) from the K pin. For instance, relay 252 may electrically couple AC unit 242 to power supply 214 in response to only receiving current in at the first polarity. In this way, relay 252 and relay 254 may be configured to operate in a fan only mode wherein only fan unit 240 is activated and an AC mode wherein both fan unit 240 and AC unit 242 are activated using K pin 232.

As shown in FIG. 2B, when in the second configuration, fan controller circuitry 222 may be configured to receive power from power supply 214 along current path 264, which charges capacitor 223. In some examples, fan controller circuitry 222 may be configured to output an indication that fan controller circuitry 222 receives power and/or an indication that fan controller circuitry 222 does not receive power. For instance, fan controller circuitry 222 may be configured to output a logical '1' to processing circuitry (e.g., processing circuitry 120 of FIG. 1A) when capacitor 223 is charging and to output a logical '0' to processing circuitry when capacitor 223 is not charging.

Moreover, switching circuitry 226 may be selectively switched to support operation of fan unit 240 and AC unit 242 using K pin 232. For example, switching circuitry may be switched-in when operating AC unit 242 to permit current path 266. That is, when in the second configuration and when switching circuitry 226 is switched-in, AC controller circuitry 224 may be configured to receive power from power supply 214 along current path 266, which charges capacitor 225. In some examples, AC controller circuitry 224 may be configured to output an indication that AC controller circuitry 224 receives power and/or an indication that AC controller circuitry 224 does not receive power. For instance, AC controller circuitry 224 may be configured to output a logical '1' to processing circuitry (e.g., processing circuitry 120 of FIG. 1A) when capacitor 225 is charging and to output a logical '0' to processing circuitry when capacitor 225 is not charging.

In this way, when fan controller circuitry 222 and AC controller circuitry 224 are configured as shown in FIG. 2B, AC controller circuitry 224 may receive power from power supply 214 along current path 266 and fan controller circuitry 222 may receive power from power supply 214 along current path 264 due to the leakage current caused by the reverse biased of the internal body diode of the fan controller circuitry 222. Accordingly, circuit 200B may represent a system configured to sense a presence or absence of voltage on a terminal (e.g., K pin 232) with current only without voltage detection method using resistors or comparator IC to detect the presence or absence of voltage on the terminal. AC controller circuitry 224 may use a small switching circuit (e.g., switching circuit 226) that is configured to turn on or off by software depending on the capacitor 225 is charged in circuit 200B. Switching elements of switching circuitry 226 may be configured to work with AC controller circuitry 224 to prevent AC unit 242 from turning on when only fan unit 240 is in operation. Additionally, processing circuitry can determine which wiring configurations controller device 210 will operate between the first configuration of FIG. 2A (e.g., C configuration) and the second configuration of FIG. 2B (e.g., K configuration) according to the wire test performed in AC controller circuitry 224.

For example, processing circuitry (e.g., processing circuitry 120 of FIG. 1A) may be configured to perform steps of Table 1 and/or Table 2. The process of Table 1 and Table 2 is discussed with respect to FIG. 3 as follows.

TABLE 1 sensing wires at pin Y and pin K

| Sequence | 0x64h Register Bits D[7] | Y_SW | Register Status VCC_OK | UV | Wire Detection | System Config. | MCU Command |
|---|---|---|---|---|---|---|---|
| 1 | 1 | 0 V | 1 | X | Y wire is present | C | Stop the following sequence |
| 2 | 1 | 0 V | 0 | X | Y wire is not present | Either C or K | Check if K is connected |
| 3 | 1 | 3.6 V | 1 | X | Y wire is present | K | Stop the following sequence |
| 4 | 1 | 3.6 V | 0 | X | Y wire is not present | Either C or K | Check the wire. |

In the example of Table 1, sequence represents a step within a step sequence, 0x65h Register Bits represents whether AC controller circuitry 224 is enabled by processing circuitry, where '1' corresponds to AC controller circuitry 224 being enabled, Y_SW indicates whether switching circuitry 226 receives an activation signal or a deactivation signal, where 0 V corresponds to a deactivation signal and 3.3 V corresponds to an activation signal, VCC_OK indicates whether AC controller circuitry 224 receives power from power supply 214, UV represents whether an undervoltage has been detected at AC controller circuitry 224, wherein 'X' indicate that there undervoltage state does not change the output of the step sequence of Table 1, wire detection indicates a state of Y pin 234 determined by processing circuitry in response to detecting the Y_SW value, system configurations indicates a wire configuration determined by processing circuitry in response to detecting the Y_SW value, and MCU command indicates a next action performed by processing circuitry.

TABLE 2 sensing wires at pin G and pin K

| Sequence | 0x65h Register Bits D[7] | Register Status | | Wire Detection | System Config. | MCU Command |
|---|---|---|---|---|---|---|
| | | Y_SW | VCC_OK | UV | | |
| 5 | 1 | 0 V | 1 | X | G wire is present | Follow the system configuration decision at Y. | Stop the following sequence |
| 6 | 1 | 0 V | 0 | X | G wire is not present | Either C or K | Check the wire. |

In the example of Table 2, sequence represents a step within a step sequence, 0x65h Register Bits represents whether fan controller circuitry 222 is enabled by processing circuitry, where '1' corresponds to fan controller circuitry 222 being enabled, Y_SW indicates whether switching circuitry 226 receives an activation signal or a deactivation signal, where 0 V corresponds to a deactivation signal and 3.3 V corresponds to an activation signal, VCC_OK indicates whether fan controller circuitry 222 receives power from power supply 214, UV represents whether an undervoltage has been detected at fan controller circuitry 222, wherein 'X' indicate that there undervoltage state does not change the output of the step sequence of Table 2, wire detection indicates a state of G pin 230 determined by processing circuitry in response to detecting the Y_SW value, system configurations indicates a wire configuration determined by processing circuitry in response to detecting the Y_SW value, and MCU command indicates a next action performed by processing circuitry.

Figure 3:
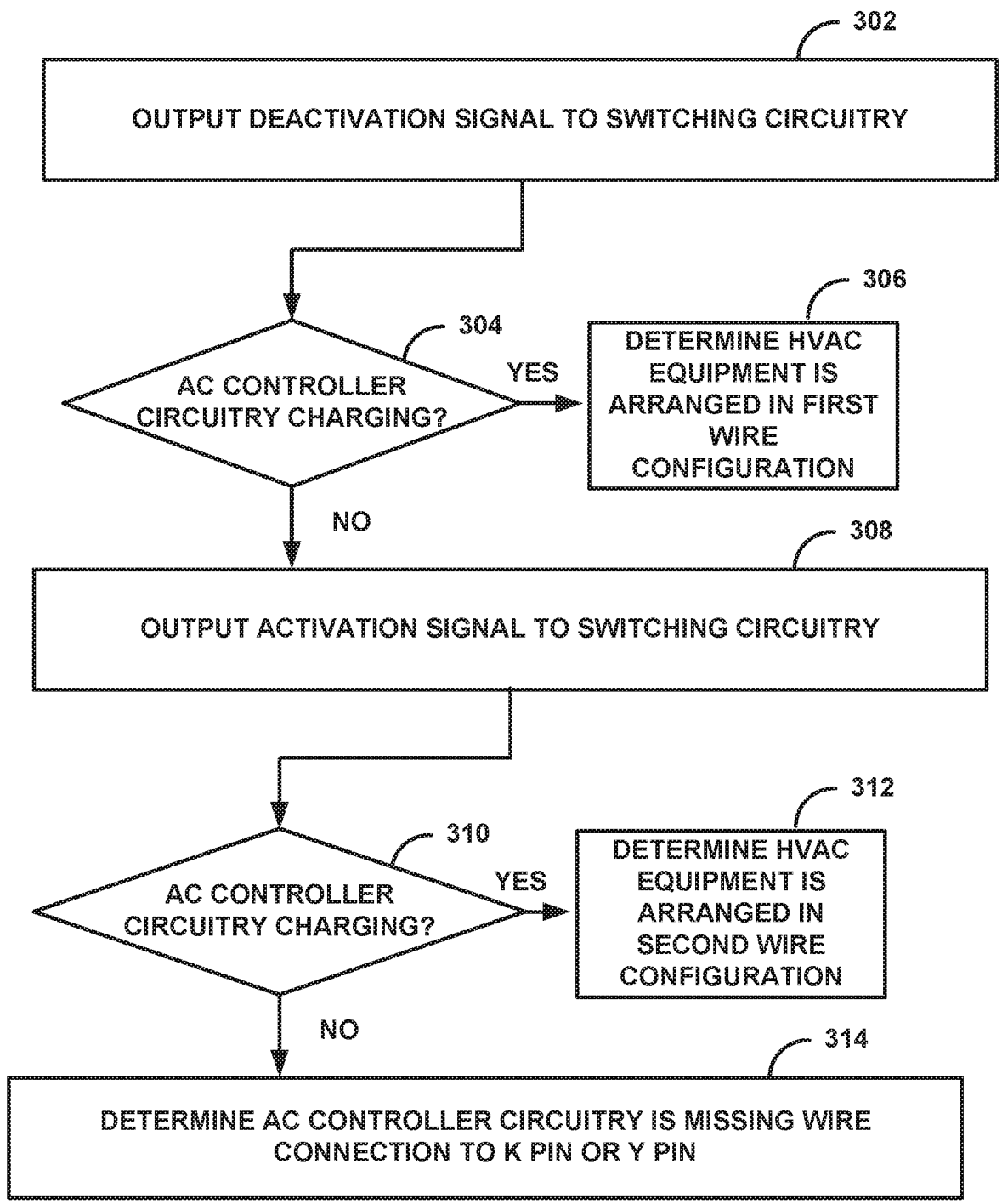
FIG. 3 is a flow diagram illustrating an example first process for detecting a wire configuration connecting a thermostat and HVAC equipment, in accordance with one or more techniques of this disclosure.

FIG. 3 is a flow diagram illustrating an example first process for detecting a wire configuration connecting a thermostat and HVAC equipment, in accordance with one or more techniques of this disclosure. FIG. 3 is discussed with reference to FIGS. 1A, 1B, 2A, and 2B for example purposes only.

In the example of FIG. 3, processing circuitry 120 may output a deactivation signal to switching circuitry 126 (302). Processing circuitry 120 may determine whether AC controller circuitry 124 receives power from power supply 114 while outputting the deactivation signal to switching circuitry 126 (304). In response to determining that AC controller circuitry 124 receives power from power supply 114 while outputting the deactivation signal to switching circuitry 126 ("YES" of 304), processing circuitry 120 may determine that HVAC equipment 112 is arranged in the first wire configuration (e.g., C configuration) (306). In some examples, the process after step 306 ends. For instance, processing circuitry 120 may refrain from determining whether AC controller circuitry 124 receives power from power supply 114 while outputting the activation signal to switching circuitry 126 in response to determining that AC controller circuitry 124 receives power from power supply 114 while outputting the deactivation signal to switching circuitry 126. In response, however, to determining that AC controller circuitry 124 does not receive power from power supply 114 while outputting the deactivation signal to switching circuitry 126 ("NO" of 304), processing circuitry 120 may output an activation signal to switching circuitry 126 (308).

Processing circuitry 120 may determine whether AC controller circuitry 124 receives power from power supply 114 while outputting the activation signal to switching circuitry 126 (310). In response to determining that AC controller circuitry 124 receives power from power supply 114 while outputting the activation signal to switching circuitry 126 ("YES" of 310), processing circuitry 120 may determine that HVAC equipment 112 is arranged in the second wire configuration (e.g., K configuration) (312). In response, however, to determining that AC controller circuitry 124 does not receive power from power supply 114 while outputting the activation signal to switching circuitry 126 ("NO" of 310), processing circuitry 120 may determine that AC controller circuitry 124 is missing a wire connection to K pin 132 or Y pin 134 (314).

Figure 4:
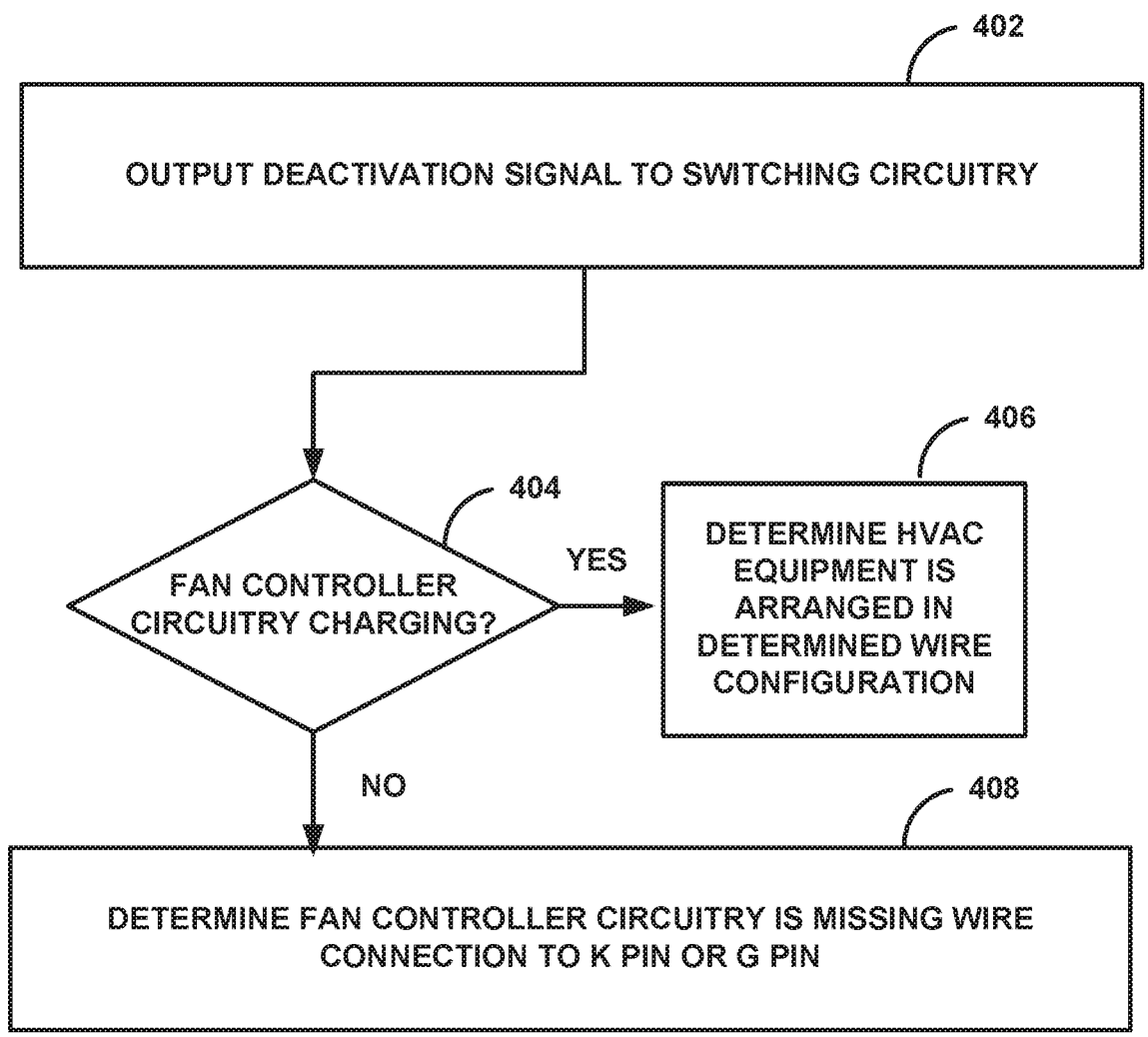
FIG. 4 is a flow diagram illustrating an example second process for detecting a wire configuration connecting a thermostat and HVAC equipment, in accordance with one or more techniques of this disclosure.

FIG. 4 is a flow diagram illustrating an example second process for detecting a wire configuration connecting a thermostat and HVAC equipment, in accordance with one or more techniques of this disclosure. FIG. 4 is discussed with reference to FIGS. 1A, 1B, 2A, 2B, and 3 for example purposes only.

In the example of FIG. 4, processing circuitry 120 may output a deactivation signal to switching circuitry 126 (402). Processing circuitry 120 may determine whether fan controller circuitry 122 receives power from power supply 114 while outputting the deactivation signal to switching circuitry 126 (404). In response to determining that fan controller circuitry 122 receives power from power supply 114 while outputting the deactivation signal to switching circuitry 126 ("YES" of 404), processing circuitry 120 may determine that HVAC equipment 112 is arranged in the determined wire configuration (e.g., determined using the process of FIG. 3) (406). In response, however, to determining that fan controller circuitry 122 does not receive power from power supply 114 while outputting the deactivation signal to switching circuitry 126 ("NO" of 404), processing circuitry 120 may determine fan controller circuitry 122 is missing a wire connection to K pin 132 or G pin 130 (408).

Figure 5:
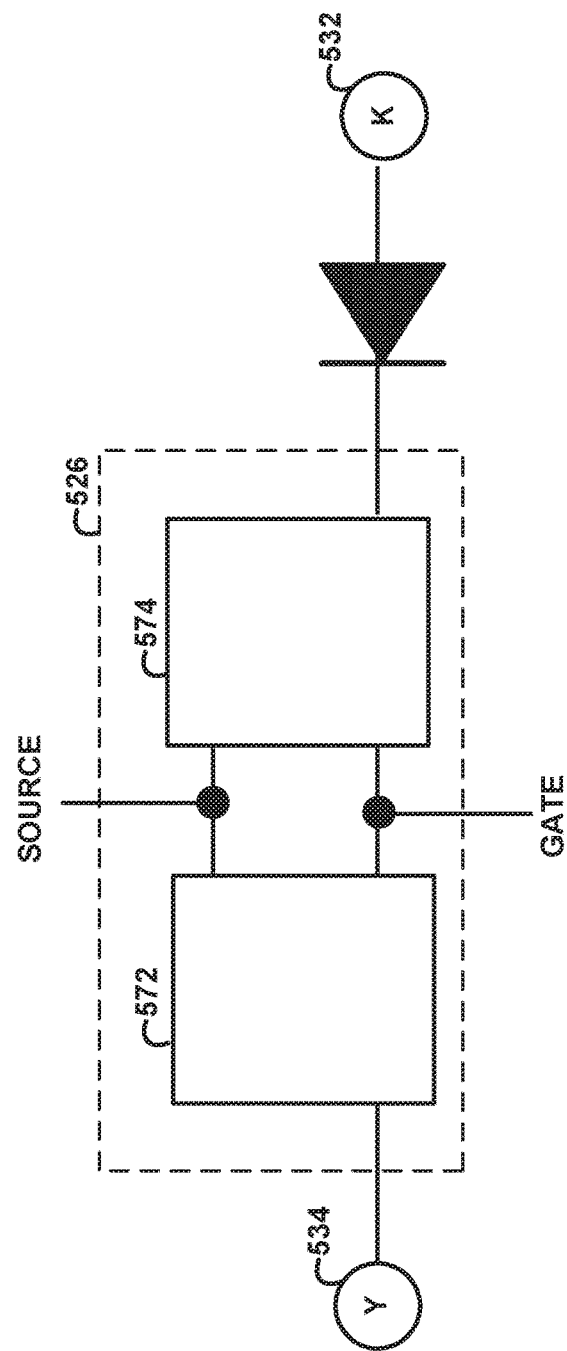
FIG. 5 is a block diagram illustrating an example of switching circuitry, in accordance with one or more techniques of this disclosure.

FIG. 5 is a block diagram illustrating an example circuit of switching circuitry 526 of the device of FIG. 1A, in accordance with one or more techniques of this disclosure. FIG. 5 is discussed with reference to FIGS. 1A, 1B, 2A, 2B, 3, and 4 for example purposes only. In the example of FIG.

5, controller device 510 may include K pin 532, and Y pin 534, which may be examples of K pin 132 and Y pin 134 of controller device 110 of FIG. 1A, respectively.

In the example of FIG. 5, switching circuitry 526 may include switching element 572 and switching element 574. Switching elements 572, 574 may be controlled by processing circuitry 120 using a timer with isolation transformer as shown in FIG. 6 or FIG. 7, or using other circuitry.

Figure 6:
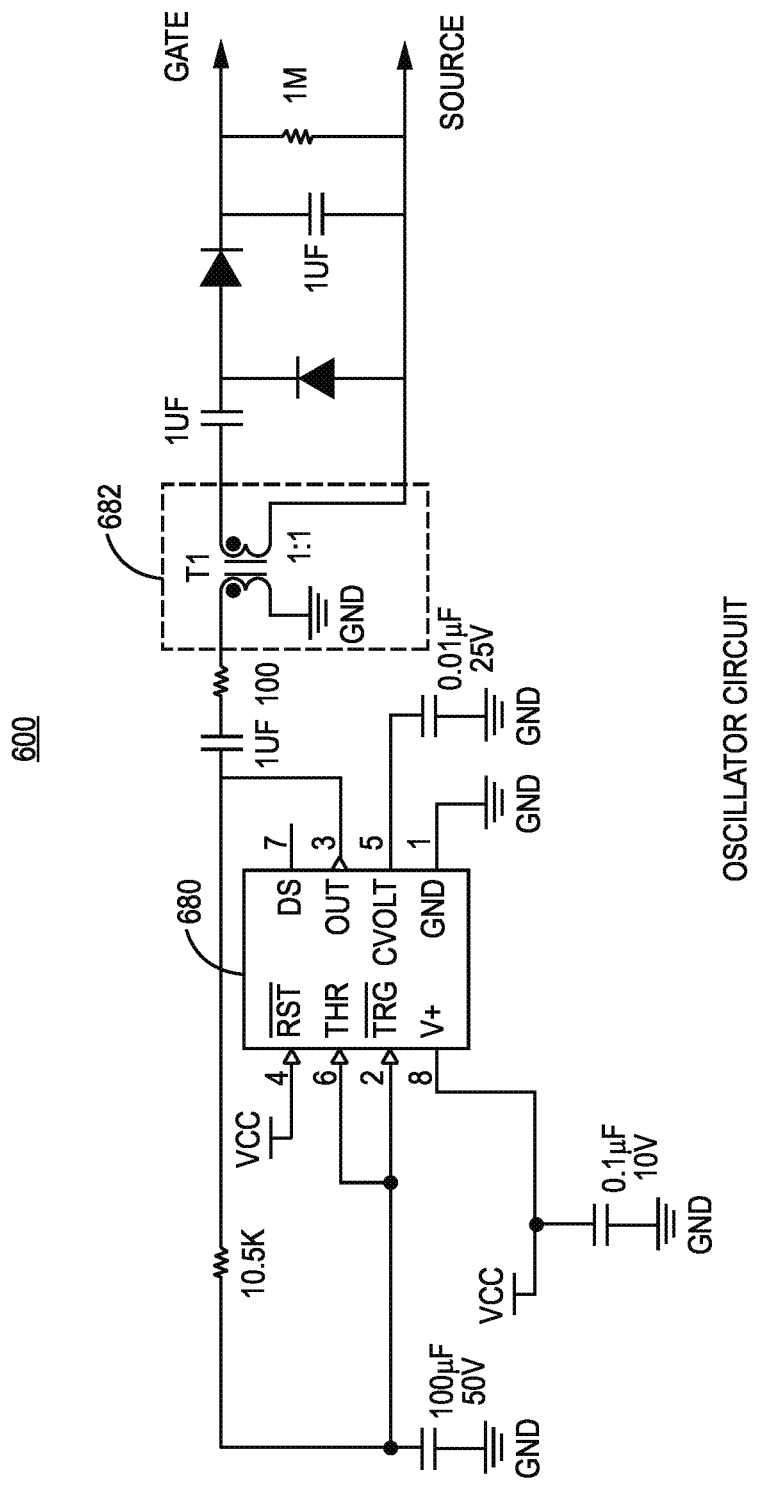
FIG. 6 is a block diagram illustrating a first example circuit for controlling the switching circuitry of FIG. 5, in accordance with one or more techniques of this disclosure.

FIG. 6 is a block diagram illustrating a first example circuit 600 of controlling switching circuitry 526 of FIG. 5, in accordance with one or more techniques of this disclosure. FIG. 6 is discussed with reference to FIGS. 1A, 1B, 2A, 2B, and 3-5 for example purposes only. In the example of FIG. 6, circuit 600 may include a system-on-chip 680. System-on-chip 680 may include a timer configured to provide an output to isolation transformer 682 to switch-in switching elements 572, 574 in response to an activation signal output by processing circuitry 120. In response to a deactivation signal output by processing circuitry 120, system-on-chip 680 may be configured to refrain from providing an output to isolation transformer 682 to that switches-in switching elements 572, 574.

Figure 7:
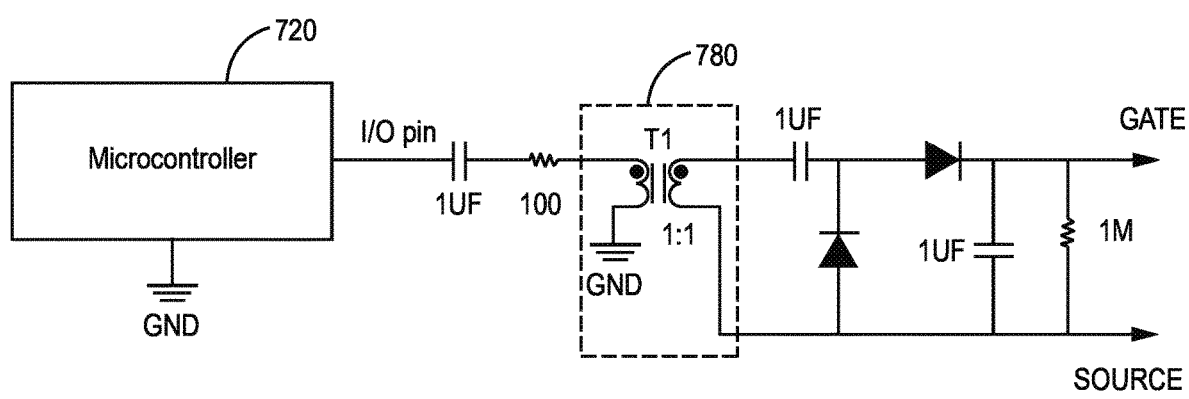
FIG. 7 is a block diagram illustrating a second example circuit for controlling the switching circuitry of FIG. 5, in accordance with one or more techniques of this disclosure.

FIG. 7 is a block diagram illustrating a second example circuit of controlling switching circuitry of FIG. 5 in accordance with one or more techniques of this disclosure. FIG. 7 is discussed with reference to FIGS. 1A, 1B, 2A, 2B, and 3-6 for example purposes only. In the example of FIG. 7, circuit 700 may include microcontroller 720, which may be an example of processing circuitry 120. In this example, microcontroller 720 may be configured to output, to isolation transformer 782, an activation signal as a Pulse Width Modulation (PWM) signal to switch-in switching elements 572, 574. In some examples, microcontroller 720 may output a deactivation signal to isolation transformer 782 that refrains from switching-in switching elements 572, 574. For instance, the deactivation signal may switch-out switching elements 572, 574.

Figure 8:
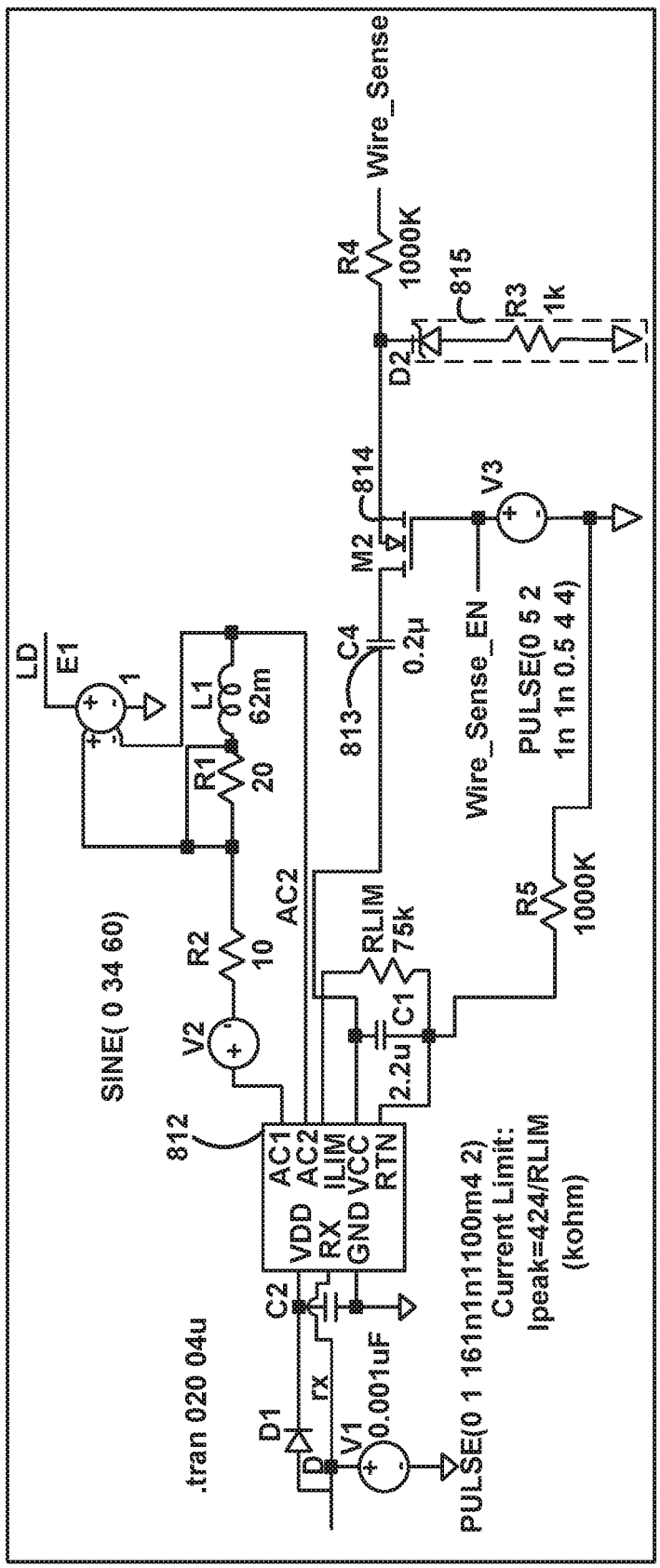
FIG. 8 is a block diagram illustrating a device for detecting a presence of a wire connecting a thermostat and HVAC equipment, in accordance with one or more techniques of this disclosure.

FIG. 8 is a block diagram illustrating a device for detecting a presence of a wire connecting a thermostat and HVAC equipment, in accordance with one or more techniques of this disclosure. A way of detecting if a wire is or is not connected to the thermostat may utilize an ASIC switch, which may be developed to replace the existing relays used in thermostat applications. However, an ASIC switch is not required and other switches and/or components may be utilized. Information below may reveal ideas of how to detect a wire connection using ASIC switch technology and/or other suitable technology.

A wire may be detected by monitoring a VCC signal (e.g., a load) externally to an ASIC switch or internally to an ASIC switch. The idea of detecting the load may be done by using an ASIC switch, such as an ASIC switch 812. ASIC switch 812 may have a VCC generation feature which provides power to its internal circuitry. VCC may start charging as soon as a load is connected to the ASIC switch 812. If the load is not connected to a terminal of ASIC switch 812, then VCC may not be present.

Techniques described herein may use the VCC signal to monitor whether a wire is connected or not. If the wire is connected, then VCC may be present as the VCC is presented when the load is connected to a terminal of ASIC switch 812 and the load is connected to the terminal of ASIC switch 812 via the wire.

An isolated sensing circuit, such as the one depicted in FIG. 8 and/or other suitable isolated sensing circuits, may be used to monitor a VCC signal externally, which will be enabled only when one wants to know if the wire is present (e.g., via ASIC switch 812). Circuit 811 may include a capacitor 813 (e.g., a 0.2 micro farad capacitor and/or other suitable capacitor) which will function in isolation from the AC signal. ASIC switch 812 may turn the circuit ON and OFF whenever the wire needs to be sensed.

During normal operation of ASIC switch 812, the Wire_Sense_Enable signal (see FIGS. 9A, 9B) may keep a MOSFET switch 814 OFF. When the wire sensing is to be active, the Wire_Sense_Enable signal may turn MOSFET switch 814 ON for a short period of time. During this period of time that MOSFET switch 814 is ON, capacitor 813 may discharge through voltage divider 815 on the other side of MOSFET switch 814. This signal may be read by a microcontroller (not shown). If the Wire_Sense Enable signal from capacitor 813 is high, then the microcontroller may determine that the wire is present in circuit 811. If the Wire Sense Enable Signal from capacitor 813 is low (e.g., 0 volts), then the microcontroller may determine that the wire is not present.

In some cases, the internal circuits of ASIC Switch 812 may already monitor the VCC signal. When the internal circuits of ASIC Switch 812 monitor the VCC signal, information from monitoring the VCC signal (e.g., values of the VCC signal) may be used to tell whether the wire is present or not by sending a VCC status (e.g., value, signal or no signal indication, and/or other suitable status) to a microcontroller side of ASIC switch 812. ASIC switch 812 may output an indication to the microcontroller indicating whether VCC is present or not.

There may be suitable additional or alternative ways that ASIC switch 812 may be able to internally detect if the wire is present. In some examples, as ASIC switch 812 may already monitor voltage and current across the terminals of ASIC switch 812 to support its over current and over voltage protection, one may use either the sensed voltage or current to determine if the wire is present. If there is voltage or current through the terminals when ASIC switch 812 is ON, then the wire may be present. If there is no current or voltage across the terminals of ASIC switch 812 when it is ON, then the wire is not necessarily present. This information may be passed to the microcontroller side of ASIC switch 812, and ASIC switch 812 may output an indication to the main microcontroller indicating whether the wire is present or not.

Figure 9A:
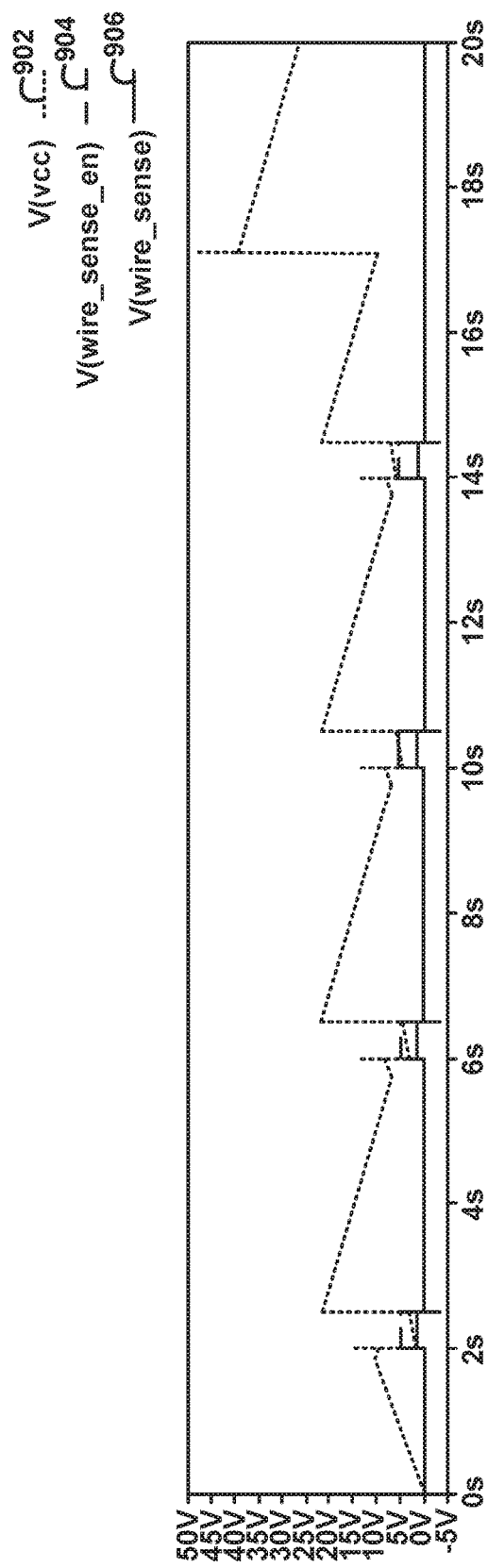
FIG. 9A is a conceptual diagram illustrating a detection of a presence of a wire connecting a thermostat and HVAC equipment, in accordance with one or more techniques of this disclosure.

FIG. 9A is a conceptual diagram illustrating a detection of a presence of a wire connecting a thermostat and HVAC equipment, in accordance with one or more techniques of this disclosure. FIG. 9A is discussed with reference to FIG. 8 for example purposes only. The abscissa axis (e.g., x axis) of FIG. 9A represents time in seconds and the ordinate axis (e.g., y axis) of FIG. 9A represents voltage 902 at VCC pin of ASIC switch 812, Wire_Sense_Enable signal 904 at a wire sense enable node of circuit 811, and voltage 906 at a wire sense node of circuit 811. FIG. 9A is discussed in further detail with FIG. 9B.

Figure 9B:
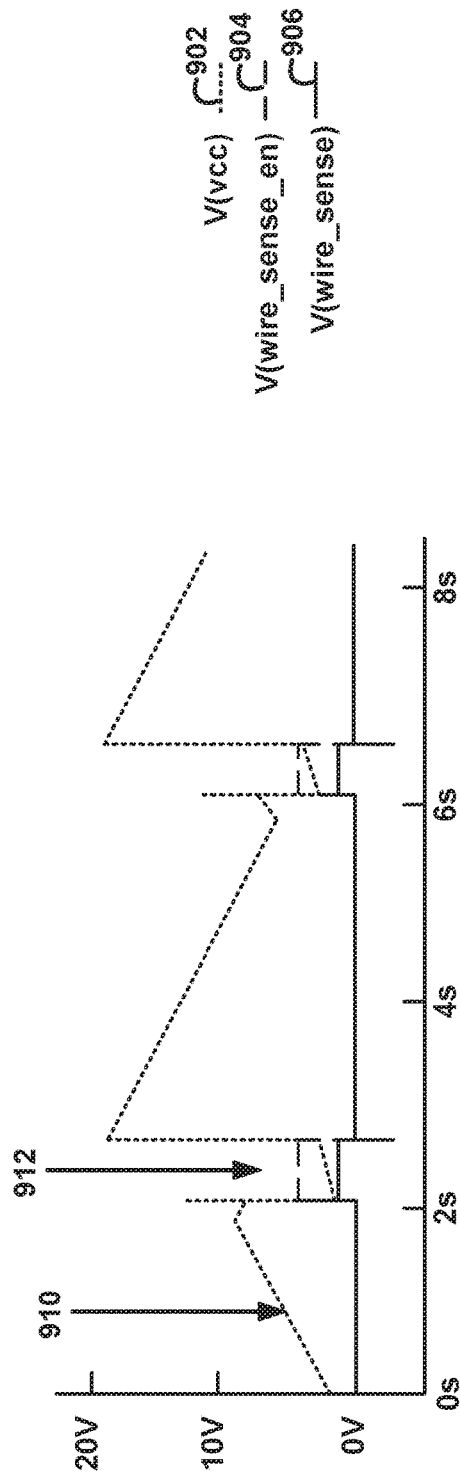
FIG. 9B is a conceptual diagram illustrating the diagram of FIG. 9A in further detail, in accordance with one or more techniques of this disclosure.

FIG. 9B is a conceptual diagram illustrating the diagram of FIG. 9 in further detail, in accordance with one or more techniques of this disclosure. As shown in FIG. 9B, during time 910, Wire_Sense_Enable signal 904 causes MOSFET switch 814 to be switched-out and the wire sense reading is not used by the microcontroller. During time 912, Wire_Sense_Enable signal 904 switches-in MOSFET switch 814 for a short period of time. During this period of time that MOSFET switch 814 is switched-in (e.g., ON), capacitor 813 may discharge through voltage divider 815 on the other side of MOSFET switch 814. Microcontroller may read the voltage 906 (e.g., "Vwire_sense"). If the Wire_Sense Enable signal 904 from capacitor 813 is high, then the microcontroller may determine that the wire is present in circuit 811. If the Wire Sense Enable Signal 904 from capacitor 813 is low (e.g., 0 volts), then the microcontroller may determine that the wire is not present.

Device described herein may include only analog circuitry, only digital circuitry, or a combination of analog circuitry and digital circuitry. Digital circuitry may include, for example, a microcontroller on a single integrated circuit containing a processor core, memory, inputs, and outputs. For example, digital circuitry of the device described herein may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor," "controller," "controller circuitry," or "processing circuitry" may generally refer to any of the foregoing analog circuitry and/or digital circuitry, alone or in combination with other logic circuitry, or any other equivalent circuitry.

Digital circuitry may utilize hardware, software, firmware, or any combination thereof for achieving the functions described. Those functions implemented in software may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure.

The techniques of this disclosure may be implemented in a wide variety of devices or apparatuses that include integrated circuits (ICs) or sets of ICs (e.g., chip sets). Various components, modules, or units are described in this disclosure to emphasize functional aspects of devices configured to perform the disclosed techniques, but do not necessarily require realization by different hardware units. Rather, various units may be combined or provided by a collection of interoperative hardware units, including one or more processors as described above, in conjunction with suitable software and/or firmware.

What is claimed is:

1. A device for detecting a wire configuration connecting a thermostat and Heating, Ventilation, and Air Conditioning (HVAC) equipment, the device comprising:
   fan controller circuitry configured to operate a fan unit of the HVAC equipment, wherein the fan controller circuitry operates the fan unit using a G pin when the HVAC equipment is arranged in a first wire configuration and wherein the fan controller circuitry operates the fan unit using a K pin when the HVAC equipment is arranged in a second wire configuration;
   Air Conditioning (AC) controller circuitry configured to operate an AC unit of the HVAC equipment, wherein the AC controller circuitry operates the AC unit using a Y pin when the HVAC equipment is arranged in the first wire configuration and wherein the AC controller circuitry operates the AC unit using the K pin when the HVAC equipment is arranged in the second wire configuration;
   switching circuitry configured to electrically couple the Y pin and the K pin in response to an activation signal and to refrain from electrically coupling the Y pin and the K pin in response to a deactivation signal; and
   processing circuitry configured to determine the HVAC equipment is arranged in the first wire configuration in response to determining the AC controller circuitry receives power from a power supply while outputting the deactivation signal to the switching circuitry.

2. The device of claim 1, wherein the processing circuitry is configured to:
   determine the HVAC equipment is arranged in the second wire configuration in response to determining the AC controller circuitry does not receive power from the power supply while outputting the deactivation signal to the switching circuitry and determining the AC controller circuitry receives power from the power supply while outputting the activation signal to the switching circuitry.

3. The device of claim 2, wherein the processing circuitry is configured to:
   determine whether the AC controller circuitry receives power from the power supply while outputting the activation signal to the switching circuitry in response to determining that the AC controller circuitry does not receive power from the power supply while outputting the deactivation signal to the switching circuitry; and
   refrain from determining whether the AC controller circuitry receives power from the power supply while outputting the activation signal to the switching circuitry in response to determining that the AC controller circuitry receives power from the power supply while outputting the deactivation signal to the switching circuitry.

4. The device of claim 1, wherein the processing circuitry is configured to:
   determine the AC controller circuitry is missing a wire connection to the K pin or the Y pin in response to determining the AC controller circuitry does not receive power from the power supply while outputting the deactivation signal to the switching circuitry and determining the AC controller circuitry does not receive power from the power supply while outputting the activation signal to the switching circuitry.

5. The device of claim 1, wherein the processing circuitry is configured to:
   determine the fan controller circuitry is missing a wire connection to the K pin or the G pin in response to determining the fan controller circuitry does not receive power from the power supply while outputting the deactivation signal to the switching circuitry.

6. The device of claim 1, comprising wire saver circuitry configured to:
   in response to receiving current in at a first polarity from the K pin:
     electrically couple the fan unit to the power supply; and
     electrically couple the AC unit to the power supply; and
   in response to receiving current at a second polarity from the K pin:
     electrically couple the fan unit to the power supply; and
     refrain from electrically coupling the AC unit to the power supply.

7. The device of claim 6, wherein the wire saver circuitry comprises:
a first relay configured to electrically couple the AC unit in response to receiving current at the first polarity from the K pin and to refrain from electrically coupling the AC unit in response to receiving current at the second polarity from the K pin; and
a second relay configured to electrically couple the fan unit in response to receiving current at the first polarity from the K pin and to electrically couple the fan unit in response to receiving current at the second polarity from the K pin.

8. The device of claim 1, wherein the switching module includes a system-on-chip comprising a relay and an oscillation circuit for activating the relay in response to the activation signal.

9. The device of claim 1, wherein the switching module comprises an isolation transformer, and one or more switching elements.

10. The device of claim 9, wherein the switching module comprises a system-on-chip comprising a timer configured to provide an output to the isolation transformer to selectively switch-in the one or more switching elements in response to the activation signal.

11. The device of claim 9, wherein processing circuitry is configured to provide the activation signal to the isolation transformer to cause the one or more switching elements to switch-in.

12. A method for detecting a wire configuration connecting a thermostat and Heating, Ventilation, and Air Conditioning (HVAC) equipment, the method comprising:
outputting, by processing circuitry, a deactivation signal to switching circuitry, wherein the switching circuitry is configured to refrain from electrically coupling a Y pin and a K pin in response to the deactivation signal,
wherein fan controller circuitry operates a fan unit of the HVAC equipment using a G pin when the HVAC equipment is arranged in a first wire configuration and wherein the fan controller circuitry operates the fan unit using the K pin when arranged in a second wire configuration;
wherein Air Conditioning (AC) controller circuitry operates the AC unit using the Y pin when the HVAC equipment is arranged in the first wire configuration and wherein the AC controller circuitry operates the AC unit using the K pin when the HVAC equipment is arranged in the second wire configuration; and
determining, by processing circuitry, the HVAC equipment is arranged in the first wire configuration in response to determining the AC controller circuitry receives power from a power supply while outputting the deactivation signal to the switching circuitry.

13. The method of claim 12, comprising:
outputting, by the processing circuitry, an activation signal to the switching circuitry, wherein the switching circuitry is configured to electrically couple the Y pin and the K pin in response to the activation signal; and
determining, by the processing circuitry, the HVAC equipment is arranged in the second wire configuration in response to determining the AC controller circuitry does not receive power from the power supply while outputting the deactivation signal to the switching circuitry and determining the AC controller circuitry receives power from the power supply while outputting the activation signal to the switching circuitry.

14. The method of claim 13, comprising:
determining, by the processing circuitry, whether the AC controller circuitry receives power from the power supply while outputting the activation signal to the switching circuitry in response to determining that the AC controller circuitry does not receive power from the power supply while outputting the deactivation signal to the switching circuitry; and
refraining from determining, by the processing circuitry, whether the AC controller circuitry receives power from the power supply while outputting the activation signal to the switching circuitry in response to determining that the AC controller circuitry receives power from the power supply while outputting the deactivation signal to the switching circuitry.

15. The method of claim 12, comprising:
determining, by the processing circuitry, the AC controller circuitry is missing a wire connection to the K pin or the Y pin in response to determining the AC controller circuitry does not receive power from the power supply while outputting the deactivation signal to the switching circuitry and determining the AC controller circuitry does not receive power from the power supply while outputting the activation signal to the switching circuitry.

16. The method of claim 12, comprising:
determining, by the processing circuitry, the fan controller circuitry is missing a wire connection to the K pin or the G pin in response to determining the fan controller circuitry does not receive power from the power supply while outputting the deactivation signal to the switching circuitry.

17. The method of claim 12, wherein wire saver circuitry is configured to:
in response to receiving current in at a first polarity from the K pin:
electrically couple the fan unit to the power supply; and
electrically couple the AC unit to the power supply; and
in response to receiving current at a second polarity from the K pin:
electrically couple the fan unit to the power supply; and
refrain from electrically coupling the AC unit to the power supply.

18. The method of claim 17, wherein the wire saver circuitry comprises:
a first relay configured to electrically couple the AC unit in response to receiving current at the first policy from the K pin and to refrain from electrically coupling the AC unit in response to receiving current at the second policy from the K pin; and
a second relay configured to electrically couple the fan unit in response to receiving current at the first policy from the K pin and to electrically couple the fan unit in response to receiving current at the second policy from the K pin.

19. A system for detecting a wire configuration connecting a thermostat and Heating, Ventilation, and Air Conditioning (HVAC) equipment, the system comprising:
a power supply;
fan controller circuitry configured to operate a fan unit of the HVAC equipment, wherein the fan controller circuitry operates the fan unit using a G pin when the HVAC equipment is arranged in a first wire configuration and wherein the fan controller circuitry operates the fan unit using a K pin when the HVAC equipment is arranged in a second wire configuration;

Air Conditioning (AC) controller circuitry configured to operate an AC unit of the HVAC equipment, wherein the AC controller circuitry operates the AC unit using a Y pin when the HVAC equipment is arranged in the first wire configuration and wherein the AC controller circuitry operates the AC unit using the K pin when the HVAC equipment is arranged in the second wire configuration;

switching circuitry configured to electrically couple the Y pin and the K pin in response to an activation signal and to refrain from electrically coupling the Y pin and the K pin in response to a deactivation signal; and processing circuitry configured to determine the HVAC equipment is arranged in the first wire configuration in response to determining the AC controller circuitry receives power from the power supply while outputting the deactivation signal to the switching circuitry.

20. The system of claim 19, wherein the processing circuitry is configured to:

determine the HVAC equipment is operating in the second wire configuration in response to determining the AC controller circuitry does not receive power from the power supply while outputting the deactivation signal to the switching circuitry and determining the AC controller circuitry receives power from the power supply while outputting the activation signal to the switching circuitry.

* * * * *